(12) United States Patent
Basol et al.

(10) Patent No.: US 7,204,924 B2
(45) Date of Patent: Apr. 17, 2007

(54) METHOD AND APPARATUS TO DEPOSIT LAYERS WITH UNIFORM PROPERTIES

(75) Inventors: Bulent M. Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 148 days.

(21) Appl. No.: 10/744,294

(22) Filed: Dec. 22, 2003

(65) Prior Publication Data

US 2004/0168926 A1 Sep. 2, 2004

Related U.S. Application Data

(60) Continuation-in-part of application No. 10/460,032, filed on Jun. 11, 2003, now Pat. No. 6,942,780, which is a continuation-in-part of application No. 10/302,213, filed on Nov. 22, 2002, which is a continuation-in-part of application No. 10/152,793, filed on May 23, 2002, which is a continuation of application No. 09/760,757, filed on Jan. 17, 2001, now Pat. No. 6,610,190, which is a continuation of application No. 09/685,934, filed on Oct. 11, 2000, now Pat. No. 6,497,800, which is a continuation-in-part of application No. 09/607,567, filed on Jun. 29, 2000, now Pat. No. 6,676,822, which is a division of application No. 09/511,278, filed on Feb. 23, 2000, now Pat. No. 6,413,388, which is a division of application No. 60/245,211, filed on Nov. 3, 2000, which is a division of application No. 09/201,929, filed on Dec. 1, 1998, now Pat. No. 6,176,992.

(51) Int. Cl.
*C25D 5/00* (2006.01)
*C25D 5/50* (2006.01)
*C25D 5/22* (2006.01)

(52) U.S. Cl. ............... 205/143; 205/137; 205/146; 205/224; 205/93

(58) Field of Classification Search ............... 205/137, 205/143, 146, 224, 93; 428/304.4, 450, 935
See application file for complete search history.

(56) References Cited

U.S. PATENT DOCUMENTS 3,328,273 A 6/1967 Creutz et al.

(Continued)

FOREIGN PATENT DOCUMENTS

DE 2008664 9/1971

(Continued)

OTHER PUBLICATIONS

James J. Kelly et al., "Leveling and Microstructural Effects of Additives for Copper Electrodeposition", Joural of the Electrochemical Society, 146 (7), 1999, pp. 2540-2545, no month.

(Continued)

*Primary Examiner*—Edna Wong
(74) *Attorney, Agent, or Firm*—Knobbe Martens Olson & Bear

(57) ABSTRACT

The present invention provides a method for forming a conductive film with uniform properties on a wafer surface that has features or cavities. During the process, the workpiece is rotated and laterally moved while an electrodeposition solution is delivered onto the wafer surface at a predetermined flow rate, and a potential difference is applied between the workpiece surface and the electrode. The workpiece is rotated about an axis at predetermined revolutions per minute so that an edge region of the workpiece has a first predetermined linear velocity due to the rotation. The workpiece has a second predetermined linear velocity due to the lateral motion. The second predetermined velocity may be larger than the first predetermined velocity. Further, the wafer may not be rotated.

25 Claims, 2 Drawing Sheets

U.S. PATENT DOCUMENTS

| | | | |
|---|---|---|---|
| 3,959,089 A | 5/1976 | Watts | |
| 4,140,598 A | 2/1979 | Kimoto et al. | |
| 4,339,319 A | 7/1982 | Aigo | |
| 4,430,173 A | 2/1984 | Boudot et al. | |
| 4,610,772 A | 9/1986 | Palnik | |
| 4,948,474 A | 8/1990 | Miljkovic | |
| 4,954,142 A | 9/1990 | Carr et al. | |
| 4,975,159 A | 12/1990 | Dahms | |
| 5,024,735 A | 6/1991 | Kadija | |
| 5,084,071 A | 1/1992 | Nenadic et al. | |
| 5,171,412 A | 12/1992 | Talieh et al. | |
| 5,256,565 A | 10/1993 | Bernhardt et al. | |
| 5,354,490 A | 10/1994 | Yu et al. | |
| 5,429,733 A | 7/1995 | Ishida | |
| 5,472,592 A | 12/1995 | Lowery | |
| 5,516,412 A | 5/1996 | Andricacos et al. | |
| 5,543,032 A | 8/1996 | Datta et al. | |
| 5,558,568 A | 9/1996 | Talieh et al. | |
| 5,681,215 A | 10/1997 | Sherwood et al. | |
| 5,692,947 A | 12/1997 | Talieh et al. | |
| 5,755,859 A | 5/1998 | Brusic et al. | |
| 5,762,544 A | 6/1998 | Zuniga et al. | |
| 5,770,095 A | 6/1998 | Sasaki et al. | |
| 5,773,364 A | 6/1998 | Farkas et al. | |
| 5,793,272 A | 8/1998 | Burghartz et al. | |
| 5,795,215 A | 8/1998 | Guthrie et al. | |
| 5,807,165 A | 9/1998 | Uzoh et al. | |
| 5,833,820 A | 11/1998 | Dubin | |
| 5,840,629 A | 11/1998 | Carpio | |
| 5,858,813 A | 1/1999 | Scherber et al. | |
| 5,863,412 A | 1/1999 | Ichinose et al. | |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,933,753 A | 8/1999 | Simon et al. | |
| 5,954,997 A | 9/1999 | Kaufman et al. | |
| 5,976,331 A | 11/1999 | Chang et al. | |
| 5,985,123 A | 11/1999 | Koon | |
| 6,001,235 A | 12/1999 | Arken et al. | |
| 6,004,880 A | 12/1999 | Liu et al. | |
| 6,027,631 A | 2/2000 | Broadbent | |
| 6,063,506 A | 5/2000 | Andricacos et al. | |
| 6,066,030 A | 5/2000 | Uzoh | |
| 6,071,388 A | 6/2000 | Uzoh | |
| 6,074,544 A | 6/2000 | Reid et al. | |
| 6,103,085 A | 8/2000 | Woo et al. | |
| 6,132,587 A | 10/2000 | Jorne et al. | |
| 6,136,163 A | 10/2000 | Cheung et al. | |
| 6,156,167 A | 12/2000 | Patton et al. | |
| 6,159,354 A | 12/2000 | Contolini et al. | |
| 6,162,344 A | 12/2000 | Reid et al. | |
| 6,176,992 B1 | 1/2001 | Talieh | |
| 6,187,152 B1 | 2/2001 | Ting et al. | |
| 6,228,231 B1 | 5/2001 | Uzoh | |
| 6,251,236 B1 | 6/2001 | Stevens | |
| 6,261,426 B1 | 7/2001 | Uzoh et al. | |
| 6,270,646 B1 | 8/2001 | Walton et al. | |
| 6,334,937 B1 | 1/2002 | Batz et al. | |
| 6,391,166 B1 * | 5/2002 | Wang | 204/224 R |
| 6,508,920 B1 * | 1/2003 | Ritzdorf et al. | 204/194 |
| 6,537,144 B1 | 3/2003 | Tsai et al. | |
| 2002/0102853 A1 | 8/2002 | Li et al. | |

FOREIGN PATENT DOCUMENTS

| | | |
|---|---|---|
| DE | 4324300 | 3/1994 |
| EP | 0706857 | 4/1996 |
| EP | 1 037 263 | 9/2000 |
| WO | WO 98/27585 | 6/1998 |
| WO | WO 00/26443 | 5/2000 |

OTHER PUBLICATIONS

Joseph M. Steigerwald et al., "Chemical Mechanical Planarization of Microelectronic Materials", A Wiley-Interscience Publication, 1997, by John Wiley & Sons, Inc. pp. 212-222, no month.

Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117-119, no month.

J.M. Steigerwald, R. Zirpoli, S.P. Murarka, D. Price and R.J. Gutman, "Pattern Geomerty Efects in the Chemical-Mechanical Polishing of Inlaid Copper Structures", Oct. 1994, p. 2842-2848.

Alan C. West, Chin-Chang Cheng and Brett C. Baker, "Pulse Reverse Copper Electrodeposition in High Aspect Ratio Trenches and Vias", Sep. 1998, p. 3070-3073.

Robert C. Contolini, Anthony F. Bernhardt and Steven Mayar, "Electrochemical Planarization for Multilevel Metallization", Sep. 1994, pp. 2503-2510.

C. Madore, M. Matlosz and D. Landolt, "Blocking Inhibitors in Catholic Leveling", I. Theoretical Analysis, Dec. 1996, p. 3927-3942.

M. Rubinstein, "Tampongalvanisieren in der Praxis, Teil 1." GALVANOTECHNIK, vol. 79, No. 10, 1988, pp. 3263-3270, no month.

* cited by examiner

METHOD AND APPARATUS TO DEPOSIT LAYERS WITH UNIFORM PROPERTIES

RELATED APPLICATIONS

"This application is a continuation in part of U.S. patent application Ser. No. 10/460,032 filed Jun. 11, 2003 (NT-200 C1), now U.S. Pat. No. 6,942,780, which is a continuation application of U.S. patent application Ser. No. 09/760,757 filed Jan. 17, 2001 (NT-200), now U.S. Pat. No. 6,610,190, which claims priority benefit of prior U.S. provisional application 60/245,211, filed Nov. 3, 2000. This application is also a continuation in part of U.S. patent application Ser. No. 10/302,213 filed Nov. 22, 2002 (NT-105 C1) which is a continuation application of U.S. patent application Ser. No. 09/685,934 filed Oct. 11, 2000 (NT-105), now U.S. Pat. No. 6,497,800. This application is also a continuation in part of U.S. patent application Ser. No. 10/152,793 filed May 23, 2002 (NT-102 DIV) which is a divisional application of U.S. patent application Ser. No. 09/511,278 filed Feb. 23, 2000 (NT-102), now U.S. Pat. No. 6,413,388. And this application is a continuation in part of U.S. patent application Ser. No. 09/607,567 filed Jun. 29, 2000 (NT-001 DIV), now U.S. Pat. No. 6,676,822, which is a divisional application of U.S. patent application Ser. No. 09/201,929 filed Dec. 1, 1998 (NT-001), now U.S. Pat. No. 6,176,992, all incorporated herein by reference."

FIELD

The present invention relates to manufacture of semiconductor integrated circuits and, more particularly to a method for depositing conductive layers with spatially uniform properties on workpiece surfaces.

BACKGROUND

Conventional semiconductor devices generally include a semiconductor substrate, such as a silicon substrate, and a plurality of sequentially formed dielectric interlayers within which conductive paths or interconnects made of conductive materials are fabricated. In an integrated circuit, multiple levels of interconnect networks laterally extend with respect to the substrate surface. Interconnects formed in sequential layers can be electrically connected using vias or contacts. Copper and copper-alloys have recently received considerable attention as interconnect materials for integrated circuits because of their superior electro-migration and low resistivity characteristics. The interconnects are usually formed by filling copper in features or cavities etched into the dielectric layers by a deposition process. The preferred method of copper deposition is electrochemical deposition. Since copper is an important interconnect material, it will be used as the example to describe this invention. It should be appreciated that the invention may be used for the deposition of many other materials such as Ni, Co, Pt, Pb etc.

In a typical process, first an insulating layer is formed on the semiconductor substrate. Patterning and etching processes are performed to form features or cavities such as trenches and vias in the insulating layer. Then, a barrier/glue layer and optionally a seed layer are deposited over the patterned surface and a conductor such as copper is electroplated to fill all the features. However, the plating process, in addition to filling the features with copper, also deposits excess copper over the top surface of the substrate. This excess copper is called an "overburden" and it is removed during a subsequent process step, which may be a chemical mechanical polishing (CMP) step, an electropolishing step, or electrochemical mechanical polishing step among others.

During the copper electrodeposition process, specially formulated acidic plating solutions or electrolytes are commonly used. These electrolytes typically contain water, acid (such as sulfuric acid), ionic species of copper, chloride ions and certain organic additives, which affect the properties and the plating behavior of the deposited material. Typical electroplating baths contain at least two of the many types of commercially available additives such as accelerators, suppressors and levelers. It should be noted that these additives are sometimes called different names. For example, the accelerator may be referred to as a brightener and the suppressor as a carrier or inhibitor in the literature. Levelers, which are a certain type of inhibitors, may also be employed. Functions of these additives in the electrolyte and the role of the chloride ion are widely known in the field, although the details of the mechanisms involved may not be fully understood or agreed upon.

FIG. 1A shows an exemplary interconnect structure after the copper plating step. The substrate 10 includes small features 12 such as high aspect ratio vias or trenches. The features are formed into a dielectric layer 16. The dielectric layer 16 has a top surface 18. The features and the surface of the dielectric are coated with a barrier/glue or adhesion layer 20 and a copper seed layer 22. The barrier layer 20 may be made of Ta, TaN or combinations of any other materials that are commonly used in copper electrodeposition. The seed layer 22 is deposited over the barrier layer 20, although for specially designed barrier layers there may not be a need for a seed layer. After depositing the seed layer 22, copper is electrodeposited thereon from a suitable plating bath to form the copper layer 24. During this step, an electrical contact is made to the copper seed layer 22 and/or the barrier layer 20 so that a cathodic (negative) voltage can be applied thereto with respect to an anode (not shown) of the electrodeposition system. The copper is electrodeposited using the specially formulated plating solutions, as discussed above. By adjusting the amounts of the additives, such as the chloride ions, suppressor/inhibitor, leveler, and the accelerator, it is possible to obtain bottom-up copper film growth in the small features 12 without defects such as voids or seams. FIG. 1B shows an unsuccessful gap-fill that has resulted in a void/seam defect 26 in an exemplary via 27. For simplicity, barrier and seed layers are not shown in this figure.

Gap fill into high aspect ratio features is a strong function of additives and plating conditions. Additive adsorption on surfaces, their mass transport to location of the via, their distribution and concentrations are all factors that can influence gap fill. Defects such as the one shown in FIG. 1B cause reliability and yield problems in interconnect structures and cannot be tolerated. Therefore, uniformity of gap fill throughout the wafer surface is critical. Since the linear velocities of different points on the surface of a rotating wafer in a process solution are different, mass transfer, additive distribution may also be different from point to point. This, in turn, causes differences in the gap-fill capability at the center and edge regions of the wafer. Features may be filled well at the center and not well near the edges. Alternately gap-fill may be perfect near the edges and not good near the center.

Resistivity or sheet resistance of interconnects is another important factor. Interconnects introduce RC time constant and delay to the operation of integrated circuits. Therefore, resistance and capacitance of interconnect structures need to be as low as possible. Electrodeposited conductors such as Cu and Cu alloys typically have small grain size in their as-deposited form. For example, Cu layers plated out of commonly used electrolytes containing organic and inorganic additives have grain sizes, which are typically smaller than 0.2 µm. Therefore, the sheet resistance of such layers is high compared to bulk copper values. For example, the resistivity of as-plated copper may be as high as 2.5 µohm-cm. When such films are stored at around room temperature for a period of time, however, the grain size increases due to a self-annealing or re-crystallization phenomenon, and the resistivity decreases, typically by about 20%. Re-crystallization process may be accelerated by applying higher heat to the wafers. Therefore, grain size of electroplated copper layers may be increased and their resistivity may be decreased by annealing the films at a temperature range of 20–500° C., preferably between 90° C. and 400° C. Since sheet resistance of electroplated copper layers decreases as their grain size increases, sheet resistance measurements are typically used to monitor re-crystallization of such films.

Long term reliability of copper interconnect structures is affected, among other factors, by the micro-structure, defectiveness, grain size, crystalline orientation or texture, resistivity and impurity content of the copper material within the interconnect features such as lines and vias. For example, large grain size is important for higher electromigration resistance and better stress migration property of interconnect structures. As described before, low sheet resistance is desirable to reduce the RC time constant. Sheet resistance or grain size differences on a wafer give rise to lower yields. Uniformity of these important parameters throughout the wafer surface is essential for better reliability and high yield.

In a typical wafer plating apparatus, wafer is rotated during plating. On a rotating substrate linear velocity increases in a radial fashion from the center of the wafer where the velocity is zero. Therefore, for a given solution flow rate, the relative velocity between the plating solution and the wafer surface is also variable on the wafer surface. This velocity differential gives rise to a difference in mass transfer at the center of the wafer versus the edge. The difference in mass transfer results in a difference in the quality of the deposited film since mass transfer plays an important role in bringing copper ions and additive species to the surface that is being plated. For example, in copper films deposited in conventional apparatus with conventional method of rotating wafers, re-crystallization rate of the central portion of the film is different than the re-crystallization rate of the edge region. Typically this radial variation is such that re-crystallization is more rapid at the edge of the wafer and decreases towards the center (see for example, M. E. Gross et al., Conference Proceedings ULSI XV, 2000 Materials Research Society, page: 85, and Malhotra et al. Conference Proceedings ULSI XV, 2000 Materials Research Society, page: 77). This is exemplified in FIG. 2, which schematically shows the variation of sheet resistance as a function of time at room temperature at the edge and center of a plated wafer. As can be seen from FIG. 2, the starting sheet resistance of as-plated copper film is high at time zero. Edge regions self-anneal in a time period of $t_1$ and sheet resistance goes down to a stabilized lower value of R, whereas the edge regions take much longer until time $t_2$ to approach this low resistance value. Typical times for re-crystallization may change from a few hours to a few days depending upon the additive concentrations, plating conditions and film thickness. For the example in FIG. 2, $t_1$ may be in the order of 10–30 hours, whereas $t_2$ may be in the order of 90–200 hours. Changes in re-crystallization times have also been correlated with change of stress and texture in Cu films. Therefore, non-uniformities observed in re-crystallization also suggest non-uniformities in texture and stress.

Although there is no conclusive understanding of this non-uniformity over the wafer surface, there have been various explanations. For example, Malhotra et al. reference mentioned above attributed the radial non-uniformity in the re-crystallization of electroplated Cu films to a radial distribution of plating impurities. M. E. Gross et al. stated that the radial variation in re-crystallization decreasing from the edge of the wafer is likely related to processing conditions that affect the surface interactions of additives. It should be appreciated that the varying linear velocity on the wafer surface can influence mass transfer and additive surface interactions and give rise to the observed non-uniformities.

It is therefore necessary, for better yields and reliability, to develop new processing tools and approaches to improve the uniformity of electroplated film properties and the uniformity of gap-fill capability.

SUMMARY

The present invention provides an electrochemical process and system for forming a conductive film with uniform properties on a workpiece surface. The conductive film formed by the process of the present invention exhibits the same properties on any location on the wafer surface. Process of the present invention minimizes the difference in mass transfer rates between the center of the workpiece and the edge of the workpiece and uniformly distributes the additive species on the entire workpiece surface.

In one aspect of the present invention, a method for electrochemically depositing a conductive material with uniform properties on a workpiece surface is provided. The surface of the workpiece includes features. During the electrochemical process, a process solution that is in physical contact with an electrode is delivered onto the workpiece surface at a predetermined flow rate. The workpiece is rotated about an axis with predetermined revolutions per minute and laterally moved in a plane that is substantially perpendicular to the axis of rotation. As a result, an edge region of the workpiece has a first predetermined linear velocity due to the rotation and the workpiece has a second predetermined linear velocity due to the lateral motion laterally moving the workpiece.

A potential difference is applied between the workpiece surface and the electrode, and a conductive film on the workpiece surface is formed.

DETAILED DESCRIPTION

The present invention provides an electrochemical process and system for forming a conductive film with uniform properties on a workpiece surface. Accordingly, the conductive film formed by the process of the present invention exhibits the same properties on any location on the wafer whether that location is at a center region or an edge region of the wafer surface. Specifically, during an electrochemical process of the present invention, the difference in mass transfer rate between the center of the workpiece and the edge of the workpiece is minimized. Further, during the process of the present invention, additive species are more uniformly distributed on the entire workpiece surface, which situation better affects the qualities of the depositing layer and its gap-filling capability. A conductive film formed using the present invention demonstrates high re-crystallization, texture, stress and gap fill uniformity.

In accordance with the principles of the present invention, during the electrochemical plating process, the mass transfer rate difference between the edge of the workpiece surface and the center of the workpiece surface may be minimized by moving the rotating workpiece so that its center point moves with a predetermined velocity such as a predetermined linear velocity. In one embodiment, for a given process solution flow rate during the process, the predetermined linear center velocity of the rotating workpiece is more than zero, or higher than the linear velocity of the edge of the workpiece due to rotational movement for at least a period of time.

The process of the present invention may be exemplified by copper electroplating a wafer using either an electroplating process such as electrochemical deposition (ECD) or electrochemical mechanical deposition (ECMD). Electrical contact to the wafer may be made by various means, such as at the circumference of the wafer or substantially all over the front surface of the wafer. ECMD process produces a planar copper layer and descriptions of various ECMD methods and apparatus can be for example found in the following patents and pending applications, all commonly owned by the assignee of the present invention. U.S. Pat. No. 6,176,992, entitled "Method and Apparatus for Electrochemical Mechanical Deposition," U.S. Pat. No. 6,534,116, entitled "Plating Method and Apparatus that Creates a Differential Between Additive Disposed on a Top Surface and a Cavity Surface of a Workpiece Using an External Influence," U.S. Pat. No. 6,482,307, entitled "Method and Apparatus For Making Electrical Contact To Wafer Surface for Full-Face Electroplating or Electropolishing" and U.S. Pat. No. 6,610,190, entitled "Method and Apparatus for Electrodeposition of Uniform Film with Minimal Edge Exclusion on Substrate."

Figure 1A:
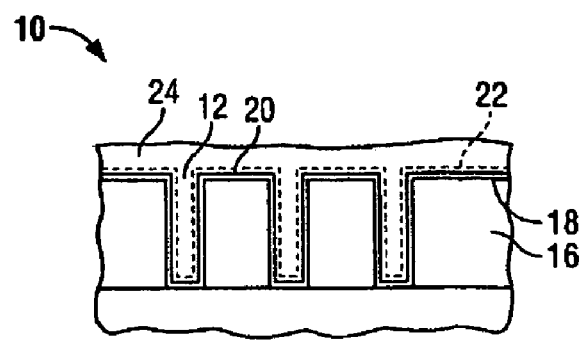
FIG. 1A is a schematic illustration of a prior art copper film electroplated onto a substrate surface having features.
Figure 1B:
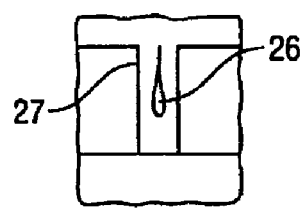
FIG. 1B is a schematic illustration of a feature having a void after the electroplating shown in FIG. 1A.
Figure 2:
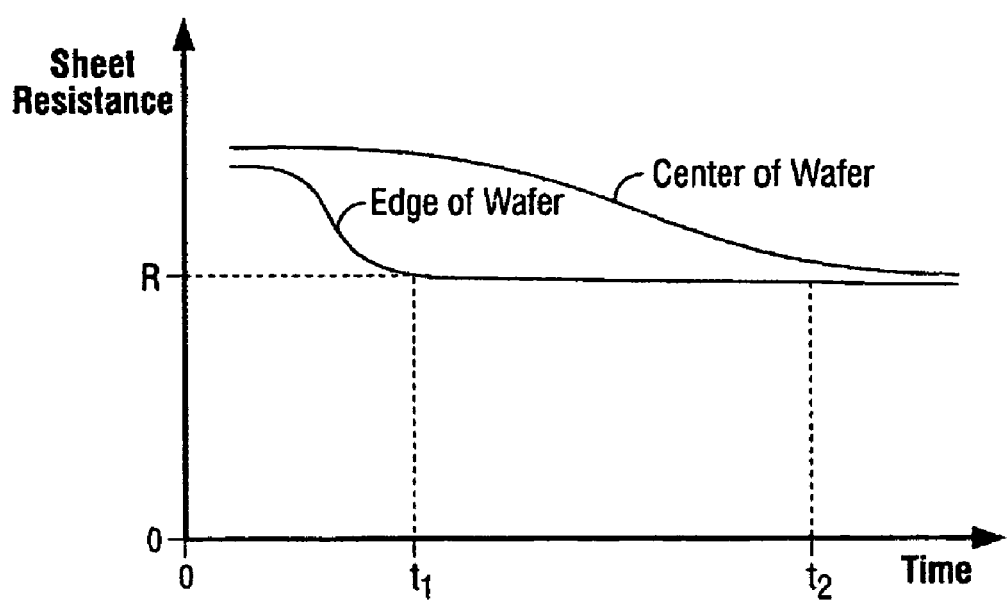
FIG. 2 is a graph depicting variation of sheet resistance at the edge and center of the copper film with annealing time.
Figure 3:
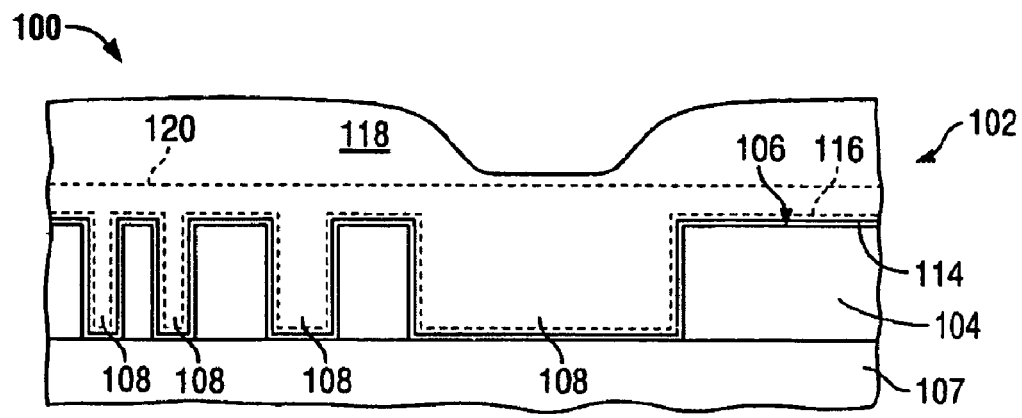
FIG. 3 is a schematic illustration of a copper film electroplated onto a wafer surface using the process of the present invention.

Reference will now be made to the drawings wherein like numerals refer to like parts throughout. FIG. 3 exemplifying a portion of a surface 100 of a semiconductor wafer 102 such as a silicon wafer. The surface may include a dielectric layer 104 having a top surface 106. The dielectric layer may be formed on a base material 107 such as a metal, semiconductor or dielectric. Features 108 are formed into the dielectric layer 104. The features 108 as well as the top surface 106 of the dielectric layer 104 are typically coated with a barrier layer 114 or glue layer such as Ta and/or TaN layer. Next, a seed layer 116, a thin film of copper is deposited on top of the barrier layer 114 for the subsequent copper plating process. For purpose of clarity, in the following figures, the seed 116 layer will no be shown. A copper layer 118 is electroplated onto the seed layer 116 using the process of the present invention. The electroplating process can be either performed using an electrochemical deposition (ECD) process or an electrochemical mechanical deposition process (ECMD). If the ECD is the plating process, the copper layer 118 is a non-uniform layer having large steps on the large features. If the ECMD is the plating process, a planar top layer shown in dotted line 120 is formed.

Figure 4:
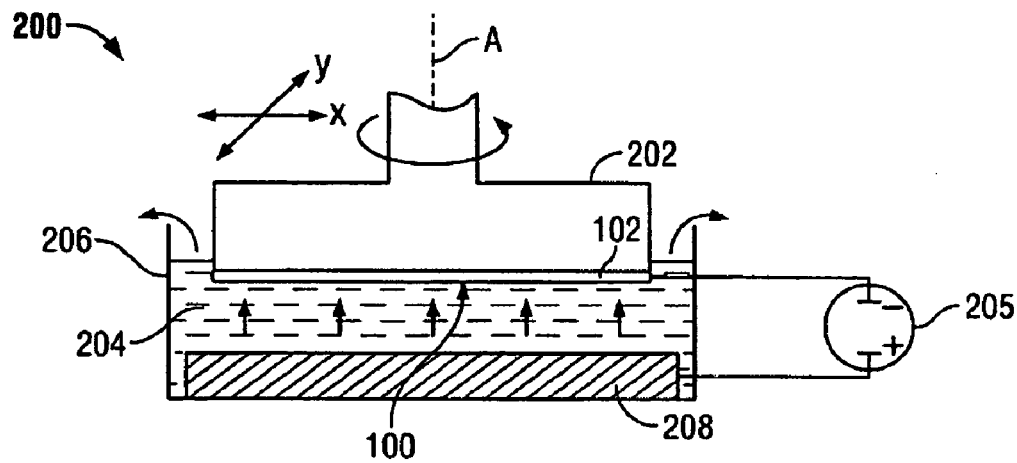
FIG. 4 is a schematic illustration of an electrochemical deposition system of the present invention.

The plating process of the present invention may be performed using the system 200 shown in FIG. 4. In system 200, the wafer 102 is held by a wafer carrier 202 to expose the surface 100 to a process solution 204 such as an electrodeposition electrolyte. As previously mentioned, at this pre-deposition stage, the surface 100 of the wafer includes the seed layer 116 (see FIG. 3) as the topmost layer. For electrochemical deposition, the surface is connected to a negative terminal of a power supply 205. The process solution is delivered into a solution container 206 and flowed towards the surface 100 of the wafer 102 during the process. The process solution 204 comprises a copper-plating electrolyte with additives. An electrode 208 is in electrical contact with the process solution 204 and is connected to a positive terminal of the power supply 205 for electrochemical deposition. The wafer carrier 202 can rotate the wafer about an axis of rotation 'A' and move the wafer laterally in x or y or both directions or in a plane that is substantially perpendicular to the axis of rotation 'A.'

Figure 5:
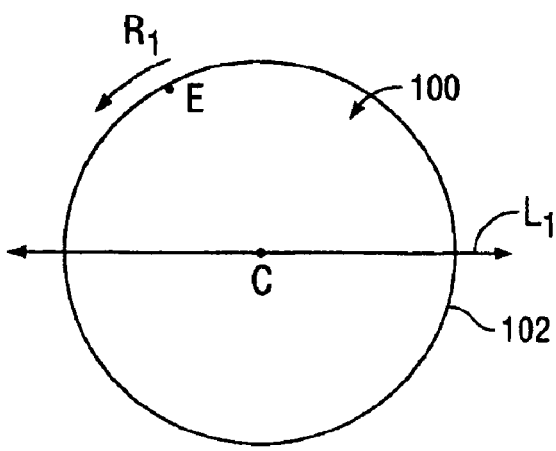
FIG. 5 is a schematic illustration of the wafer in bottom view as the wafer is rotated and laterally moved with the process of the present invention.

FIG. 5 shows a view of the surface 100 as the wafer 102 is rotated in a first rotational direction $R_1$ with predetermined revolutions per minute (rpm) and moved laterally along a lateral axis $L_1$. As the wafer 102 is rotated in the first rotational direction $R_1$, linear velocity of point E or a first predetermined linear velocity on the edge of the surface 100 due to rotation may be $v_E$. The lateral axis $L_1$ is parallel to the surface 100 and crosses the center C of the surface 100. The lateral motion of the surface 100 may be unidirectional, bi-directional or orbital or the like. During the process, lateral motion may be performed with a predetermined linear velocity $v_L$ or a second predetermined linear velocity. Therefore, linear velocity $v_C$ of the center point C during the electrochemical deposition process is equal to the $v_L$, the second predetermined linear velocity. The difference between $v_C$ and $v_E$ in a rotating wafer without the application of a lateral motion is large since $v_C$ is zero. However, with lateral motion, the point E is plated as it moves with combination of linear velocities $v_E$ and $v_C$. The point C is plated with linear velocity of $v_C$.

During the electrochemical process, for a given constant process solution flow rate, if linear center velocity $V_C$ is given a velocity value larger than zero, mass transfer difference between the edge and center of the surface 100 is drastically reduced. By increasing $V_C$ and reducing VE, one can reduce any differences further. For example, in a 300 mm diameter wafer the linear velocity of the center point due to rotation is zero. The linear velocity of the edge point, on the other hand, is 94 cm/sec if the wafer is rotated at 60 rpm. This large difference in linear velocities causes non-uniformities in the prior-art techniques. By translating this wafer in a lateral direction by for example, a speed of 40 cm/sec and rotating the wafer at 5 rpm, the linear velocity at the edge due to rotation becomes only 7.8 cm/sec. The linear velocity at the edge due to lateral translation, on the other hand, is 40 cm/sec. The linear velocity of the center of the wafer being moved in a lateral direction is preferably in the range of about 20–500 mm/sec. By this way, differential of speed between edge and center of the wafer is minimized. As a result the copper layer has a high degree of uniformity in its properties and also the gap-fill capability is uniform. It should be appreciated that to make linear velocities constant everywhere on the wafer surface, wafer may not be rotated but only laterally translated. After the electrochemical deposition process of the present invention, an anneal step is performed to anneal the deposited copper layer, as mentioned above.

Although various preferred embodiments have been described in detail above, those skilled in the art will readily appreciate that many modifications of the exemplary embodiment are possible without materially departing from the novel teachings and advantages of this invention.

We claim:

1. A method for electrochemically depositing a conductive material with uniform properties on a workpiece surface having features therein, the method comprising:
    providing a process solution that is in physical contact with an electrode;
    delivering the process solution onto the workpiece surface at a predetermined flow rate;
    rotating the workpiece about an axis at a rotational speed so that an edge region of the workpiece has a first linear velocity;
    laterally moving the workpiece at a second linear velocity; and forming a conductive film on the workpiece surface by applying a potential difference between the workpiece surface and the electrode while rotating and laterally moving the workpiece in order to minimize a relative differential of speed between the edge region and a center of the workpiece relative to rotation alone, wherein the second linear velocity is larger than the first linear velocity.

2. The method of claim 1, wherein laterally moving comprises moving the workpiece in a plane that is substantially perpendicular to the axis of rotation.

3. The method of claim 1, wherein forming the conductive film on the workpiece surface comprises growing conductive material grains having substantially the same size anywhere on the surface.

4. The method of claim 3, further comprising annealing the conductive film after forming the conductive film.

5. The method of claim 4, wherein during annealing, the conductive film has substantially the same re-crystallization rate everywhere on the surface.

6. The method of claim 1, wherein the conductive film is formed with substantially the same texture everywhere on the surface.

7. The method of claim 1, wherein the conductive film is formed with uniform stress distribution everywhere on the surface.

8. The method of claim 1, wherein forming the conductive film uniformly fills the features with the conductive material everywhere on the surface.

9. The method of claim 1, wherein forming the conductive film on the workpiece surface comprises growing conductive material grains having substantially the same size everywhere on the surface.

10. The method of claim 9, further comprising annealing the conductive film after forming.

11. The method of claim 10, wherein during annealing the conductive film has substantially the same re-crystallization rate everywhere on the surface.

12. The method of claim 9, wherein the conductive film is formed with substantially the same texture everywhere on the surface.

13. The method of claim 9, wherein the conductive film is formed with uniform stress distribution everywhere on the surface.

14. The method of claim 9, wherein forming the conductive film uniformly fills the features with the conductive material anywhere on the surface.

15. The method of claim 1, wherein the conductive film is formed with uniform re-crystallization, texture, stress and gap fill.

16. The method of claim 1, wherein laterally moving comprises a unidirectional lateral motion.

17. The method of claim 1, wherein laterally moving comprises a bi-directional lateral motion.

18. The method of claim 1, wherein the depositing comprises an electrochemical mechanical deposition, further comprising contacting the workpiece surface with a polishing pad while forming the conductive film.

19. The method of claim 1, wherein the second linear velocity is in a range of 20–500 mm/sec.

20. A method for electrochemically depositing a conductive material with uniform properties on a workpiece surface having features therein, the method comprising:
    providing a process solution that is in physical contact with an electrode;
    delivering the process solution onto the workpiece surface at a predetermined flow rate;
    rotating the workpiece about an axis at a rotational speed so that an edge region of the workpiece has a first linear velocity;
    laterally moving the workpiece at a second linear velocity; and
    forming a conductive film on the workpiece surface by applying a potential difference between the workpiece surface and the electrode while rotating and laterally moving the workpiece in order to minimize a relative differential of speed between the edge region and a center of the workpiece relative to rotation alone, wherein during laterally moving, the second linear velocity is in a range of 20–500 mm/sec.

21. The method of claim 20, wherein laterally moving comprises moving the workpiece in a plane that is substantially perpendicular to the axis of rotation.

22. The method of claim 20, further comprising annealing the conductive film after forming the conductive film, wherein during annealing, the conductive film has substantially the same re-crystallization rate everywhere on the surface.

23. The method of claim 20, wherein the conductive film is formed with uniform re-crystallization, texture, stress and gap fill.

24. The method of claim 20, wherein laterally moving comprises a unidirectional lateral motion.

25. The method of claim 20, wherein laterally moving comprises a bi-directional lateral motion.

* * * * *

UNITED STATES PATENT AND TRADEMARK OFFICE
CERTIFICATE OF CORRECTION

PATENT NO. : 7,204,924 B2  Page 1 of 1
APPLICATION NO. : 10/744294
DATED : April 17, 2007
INVENTOR(S) : Bulent M. Basol and Homayoun Talieh It is certified that error appears in the above-identified patent and that said Letters Patent is hereby corrected as shown below:

Title Page; item (56);

At Page 1, Column 2 (Other Publications), line 2, please delete "Joural" and insert -- Journal --, therefor.

At Page 2, Column 2 (Other Publications), line 9, please delete "Efects" and insert -- Effects --, therefor.

At Column 1, Line 21, delete "6,413,388. And" and please insert -- 6,413,388, and --, therefor.

At Column 6, Line 51, delete "VE," and please insert -- $V_E$, --, therefor.

Signed and Sealed this

Twenty-fourth Day of February, 2009

JOHN DOLL
*Acting Director of the United States Patent and Trademark Office*